Figure 1:
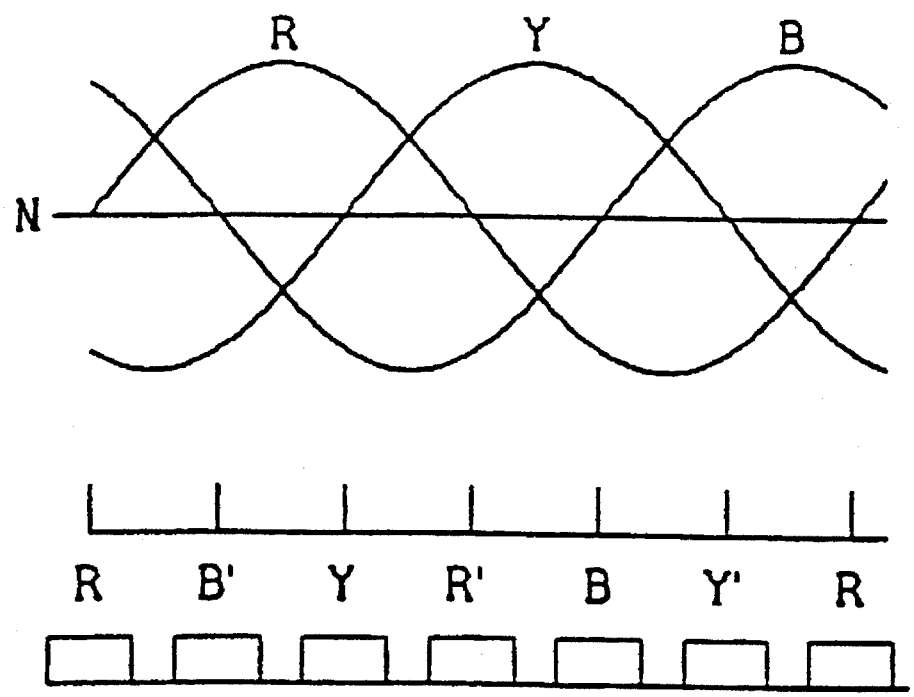

United States Patent

Allison et al.

[11] Patent Number: 5,617,329
[45] Date of Patent: Apr. 1, 1997

[54] MAINS PHASE DETERMINATION

[75] Inventors: Robert J. Allison, Basingstoke; Stephen D. Farnsworth, Aylesbury; Edward J. D. Fisher, Sheffield; David R. Scholefield, Winchester, all of United Kingdom

[73] Assignee: Remote Metering Systems Ltd., Hants, United Kingdom

[21] Appl. No.: 564,248

[22] PCT Filed: Jun. 27, 1994

[86] PCT No.: PCT/GB94/01392

§ 371 Date: Mar. 15, 1996

§ 102(e) Date: Mar. 15, 1996

[87] PCT Pub. No.: WO95/00991

PCT Pub. Date: Jan. 5, 1995

[30] Foreign Application Priority Data

Jun. 25, 1993 [GB] United Kingdom .................. 9313198

[51] Int. Cl.⁶ ............................................ H04B 3/58
[52] U.S. Cl. .................... 364/492; 364/493; 364/514; 340/825.21
[58] Field of Search ................... 340/310.01, 870.02, 340/870.03, 310.06, 825.06, 825.007, 825.54, 825.2, 825.21; 375/200, 356; 370/85.1; 364/483, 484, 492, 493, 514 C; 307/11–13

[56] References Cited

U.S. PATENT DOCUMENTS

| | | | |
|---|---|---|---|
| 3,973,087 | 8/1976 | Fong | 179/170 R |
| 4,382,248 | 5/1983 | Pai | 340/310 A |
| 4,626,622 | 12/1986 | Bouvrette | 379/99 |
| 5,055,769 | 10/1991 | Gentile | 324/86 |
| 5,510,700 | 4/1996 | Pomatto | 324/66 |

Primary Examiner—Emanuel T. Voeltz
Assistant Examiner—Craig Steven Miller
Attorney, Agent, or Firm—Lowe, Price, LeBlanc & Becker

[57] ABSTRACT

An apparatus and method for remotely determining the phase of a single phase load on a multi-phase power distribution system, including powerline communications and repeaters. The phase determination being based upon comparison of message receipt times.

12 Claims, 3 Drawing Sheets

MAINS PHASE DETERMINATION

The present invention relates to determining the phase of public-type electric power supplies, ie power supplies provided by utility companies and the like to the general public, both commercial/industrial and private (residential); such power supplies are commonly referred to as the "mains" (usually for the low voltage portions of the system) or "grid" (usually for the high voltage portions of the system).

For various reasons mains or grid systems are normally 3-phase AC systems, operating at 50 or 60 Hz. The 3 phases are conventionally taken as R, Y, and B (red, yellow, and blue), and the common (star point) as N (neutral).

It is desirable for the loading of the 3 phases to be broadly balanced. Some types of consuming devices, eg large electric motors, large-scale heating systems, and the like, are similarly 3-phase. However, many consuming devices are single-phase. Commercial and industrial users are generally supplied with a 3-phase supply, and to the extent that their individual consuming devices are single-phase, they can be encouraged in various ways to design and operate their systems so that the load they impose is broadly balanced. Residential and other small users, however, are normally supplied only with a single phase. The supply company therefore has to try to balance the load resulting from such consumers, by an appropriate pattern of connection of the different small users to the 3 phases of the supply.

This balancing can be achieved in various ways. The number of single-phase users will normally be reasonably large, and a random pattern of connection to the 3 phases will therefore generally result automatically in a rough balancing. If this is deemed inadequate, then a suitable pattern of connections to the 3 phases can be deliberately adopted, eg by connecting houses (or groups or blocks of houses) to the 3 phases in a regular pattern.

In general however, the balancing achieved by these methods will only be approximate. Even if the connections are deliberately made in a pattern intended to achieve balance, there will be an imbalance due to differing loads between users of different sizes, and differing patterns of usage between different users. Further, as new users require connection and old users require disconnection, there will be changes in the system which will shift the balance.

To achieve a good balance, two things are necessary: knowledge of the actual loadings of the 3 phases, and the ability to adjust these loadings. It is obviously useless to consider adjusting the phase loadings without knowledge of their actual loadings. But if that knowledge is available, then suitable actions can be taken to improve the balance between the 3 phases. If it is not practical to go out immediately and change the phase supplied to particular consumers, then such changes can be made in the course of other work as that work is required; also, when fresh consumers are being connected, they can be connected to the appropriate phases to improve the general balance.

Knowledge of the loadings of the 3 phases can be gained by monitoring the mains supplies, eg at transformer and switching stations. However, there are certain difficulties in achieving this; further, this gives no information about which consumers are connected to which phases or what loads the different consumers place on their phases. It is therefore desirable for the phases and loads of the individual consumers to be available.

Hitherto this information has not generally been available, or if it has been available, it has not been in a form which can readily be utilized. Although the loads drawn by the various consumers are of course monitored and known, for billing purposes, the phases to which individual consumers are connected are often not known, and even if they are known, it has not been feasible to link this information with the detailed geographical structure of the supply network.

Systems for the remote reading of meters over the supply network are now, however, becoming practicable. Such systems use high frequency signalling over the mains system, typically using FSK signalling in the region of 3–150 kHz. (There are standards covering such signalling, eg the European CENELEC standard, which reserves the 9–95 kHz band for electricity suppliers and their licencees.) The geographical structure of such remote meter reading systems automatically matches the geographical structure of the supply network. The required information regarding the loads imposed by the different consumers and the loading of the 3 different phases can therefore readily be generated in a usable form.

But for this to work, the phases of the different consumers must be known. For a new consumer, this information is apparently readily available, since the phase that that consumer is to be connected to can normally be determined. But even with this simple situation, logging the information into the load balance monitoring system involves an overhead, and there is the possibility of error in connecting the consumer or logging the information into the system. With existing consumers, the problem of identifying their phases is considerably worse.

The evolution of the supply system over time will also cause problems. There may be phase changes between different sections as a result of system maintenance, involving further overheads in maintaining the load balance monitoring system information up to date. Further, sections may be transferred from one transformer to another, again involving overheads in maintaining the system information up to date.

As a result, there are considerable practical difficulties in operating a load balance monitoring system even with a remote meter reading system.

The object of the present invention is broadly to provide a way of overcoming these difficulties.

Accordingly the present invention provides a remote metering system comprising a multi-phase mains supply system having a control unit and a plurality of single-phase consumer meter units with messages passing between the meter units and the control unit, characterized by phase determining means comprising synchronizing means in the units for synchronizing their message processing to specific phases of the mains supply, and means for determining the relative phases of the control unit and a meter unit from the timing of a message passing between them relative to the phases to which those units are synchronized. The invention also provides a meter unit including phase determining means as just defined.

The natural geographical area for a remote metering system is the area served by a switching or transformer station. This is thus the natural location for the control unit, which will be the central station of the remote metering system. The present invention will thus make available, at the central station, information regarding the individual loadings placed on the area by the various consumers together with the phases of those consumers. This makes it relatively easy to modify the connections of consumers in the area to minimize any imbalance, either by changing the connections of existing consumers or by adding new consumers to the appropriate phases.

The phase to which a meter unit is synchronized will of course be the phase to which it is attached. The control unit will be coupled to all 3 phases, so that it can communicate with a meter on any phase; it can therefore be synchronized to any of the 3 phases. The synchronization can be to any distinctive point on the waveform of the relevant phase, eg to the positive-going zero crossing.

In a simple form of the present system, each meter sends out its messages to the control unit with their starts at the synchronization point, ie the positive-going zero crossing of its phase. The control unit compares the instant when it receives the start of the message with its synchronization with, say, the R phase. If the start of the message as received at the control unit coincides with that station's synchronization, then the meter is connected to the R phase; if it is shifted by +120° or −120°, then the meter is connected to the Y or B phase respectively.

In some situations, it is possible for a meter to be connected the wrong way round, ie with the phase and neutral lines interchanged. This situation will be detected by the present system, since the meter signal timing will be 180° off, ie at 180°, −60°, or 60° (for the R, Y, and B phases respectively).

The effectiveness of the system is of course limited by the effects of timing inaccuracies and signal transmission times. But in practice this will not cause any difficulties. For a mains frequency of 50 Hz, the corresponding cycle time is 20000 μs, so the interval between adjacent synchronization times (allowing for reverse connections) is ⅙ of this, ie some 3000 μs. The message signal frequencies are preferably in the region of 50–100 kHz, and the message start times can be determined to accuracies of the order of the signal frequency cycle time, ie 10–20 μs, which is very much smaller than 3000 μs. The signal processing circuitry of the meters and control unit can easily run at frequencies well in excess of 1 MHz, corresponding to 1 μs, which is in turn much smaller than 10–20 μs. Further, 3000 μs corresponds to a transmission distance in the region of 100 km, which is very much larger than the area served by a control unit of any likely remote metering system.

In the system as described so far, messages (or at least those messages used for phase determination) must be sent out at the synchronization points. This condition restricts the maximum message rate. It is therefore preferred to modify the system to avoid this restriction.

This can be done by including, in each unit, a timer which is synchronized to the synchronization points, and including in each message the count of the timer when the message is actually transmitted. This timer count is equivalent to the phase shift between the synchronization point and the point at which the message is actually transmitted, and the receiving unit can easily take this phase shift into account when determining the relative phase of the transmitting unit.

In most remote metering systems, messages will pass in both directions between the control unit and the meters. In such systems, the phase of a meter can equally well be determined by the meter. The control unit will send out its messages synchronized to the synchronization point, and each meter will then compare its own synchronization point with the instant when it receives the start of the message.

The meter must then, of course, include its phase in some message which it subsequently sends to the control unit. This phase information can either be included in all messages which the meter sends to the control unit, or only in response to a specific request from the control unit. It is convenient to adopt the former alternative, since the phase information requires only 3 bits. (There are 6 possible phases for a meter; R, Y, B, and each reversed. These 6 possibilities can easily be coded by 3 bits. This leaves 2 codes unused, either or both of which can be used to indicate eg error or failure conditions.) This phase information will therefore occupy only a small proportion of any reasonably sized message.

We have assumed so far that the messages are transmitted directly between the meters and the control unit. The signal transmission characteristics of mains systems are however often far from ideal. There can be significant attenuation of the signals, and also reflection and hence possible "dead" areas.

As noted above, the natural geographical area for a remote metering system is the area served by a switching or transformer station, which is thus the natural location for the control unit. However, this natural area will often be larger than the area in which direct signalling is reasonably reliable. To achieve effective signalling throughout such an area, some form of signal relaying or repeating is therefore required.

If the remote metering system uses direct repeating, with no significant delay of the messages as they pass through the repeaters, then the determination of the phases of the meters is not affected. But if the system uses some form of message storage and forwarding, then the timing of the messages through the relay stations will be delayed. If the delay is liable to be a significant fraction of a mains cycle, this causes complications for the present system of determining the phase of the meters.

One way of overcoming these complications is for each relay station to measure the time delay between its receiving a message to be forwarded and its retransmission of that message, and to include that time delay in the message, as the phase shift between receipt and retransmission. If a message can be transmitted at any time and includes the phase shift between the synchronization time and the actual time of transmission, as discussed above, then the phase shift in the relay station has merely to be added to the phase shift already in the message.

An alternative way is for each relay station to act as a control unit for the purpose of determining the phase of the meters with which it communicates. The phase of the meter is determined relative to the phase of the relay station, by means of a message between the meter and the relay station. This phase is then incorporated in a message from the meter to the central station, either as the message leaves the meter (if the phase is determined by the meter) or as the message passes through the relay station (if the phase is determined by relay station). The phase of the relay station relative to the central station is determined, in the same way, by means of a message between the relay station and the central station. The central station can then combine the phase of the relay station and the phase of the meter relative to the relay station to determine the absolute phase of the meter.

Both these ways of dealing with the presence of a relay station extend naturally to systems in which there may be a chain of relay stations between a meter and the central station.

A relay station may be coupled either to all 3 phases or to just one phase. In both cases, it is necessary to determine the phase relationships between the relay station and both the central station and the meters whose messages it relays.

In the former case, the relay station will receive signals from meters coupled to each of the 3 phases; since it and the central station may be coupled to the 3 phases differently, the phase relationship of the relay station relative to the central station also has to be determined. In the latter case, the phase relationship of the relay station relative to the central station obviously has to be determined; the phase relationship of the relay station relative to the meters with which it communicates also has to be determined, since there may be sufficient coupling in the supply system for a meter on one phase to communicate with a relay station on another phase.

A form of remote metering system with relaying has been proposed in which every meter unit can also act as a relay unit. This form of remote metering system can obviously support the present system of determination of the phases of the meters, with the meters, when they act as relay units, performing either the appropriate phase determination or the appropriate addition of phase delay into messages.

Figure 2:
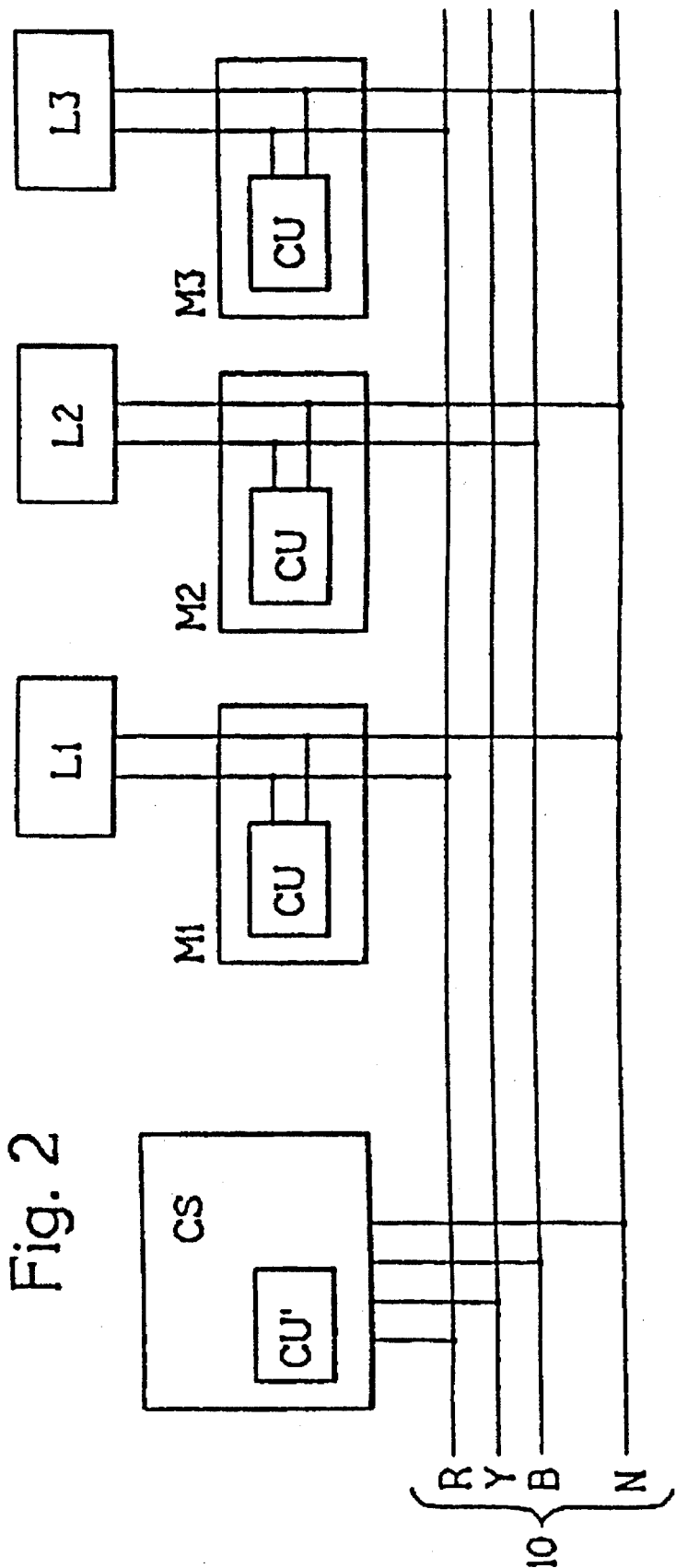
Figure 3:
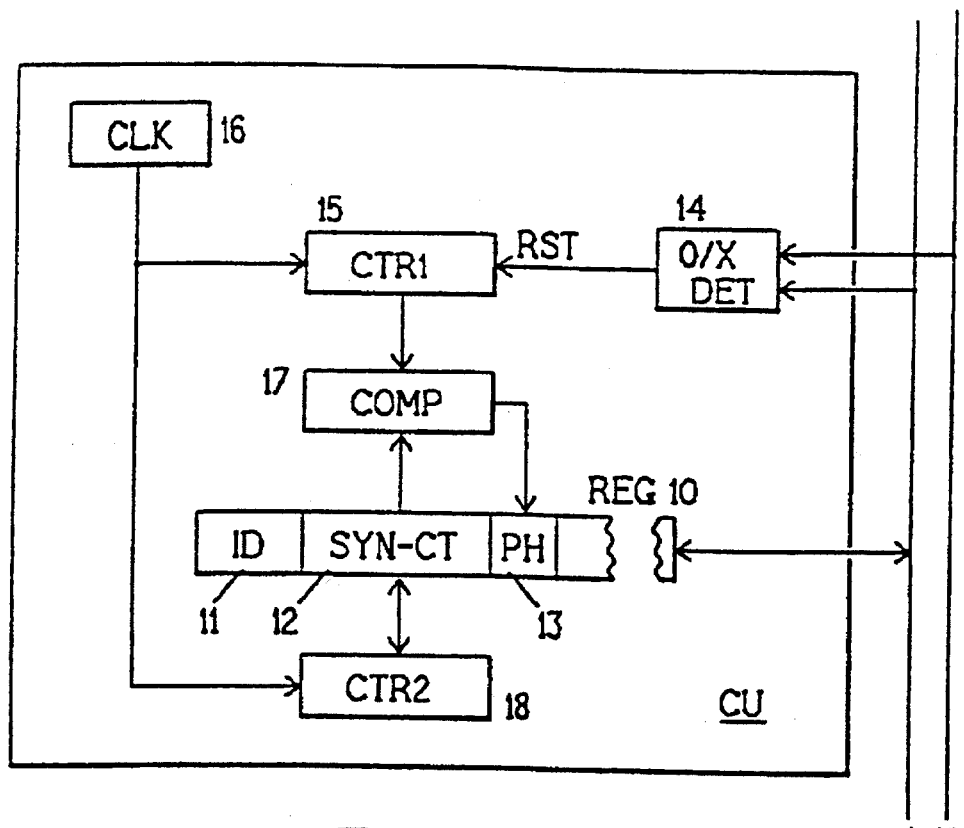
Figure 4:
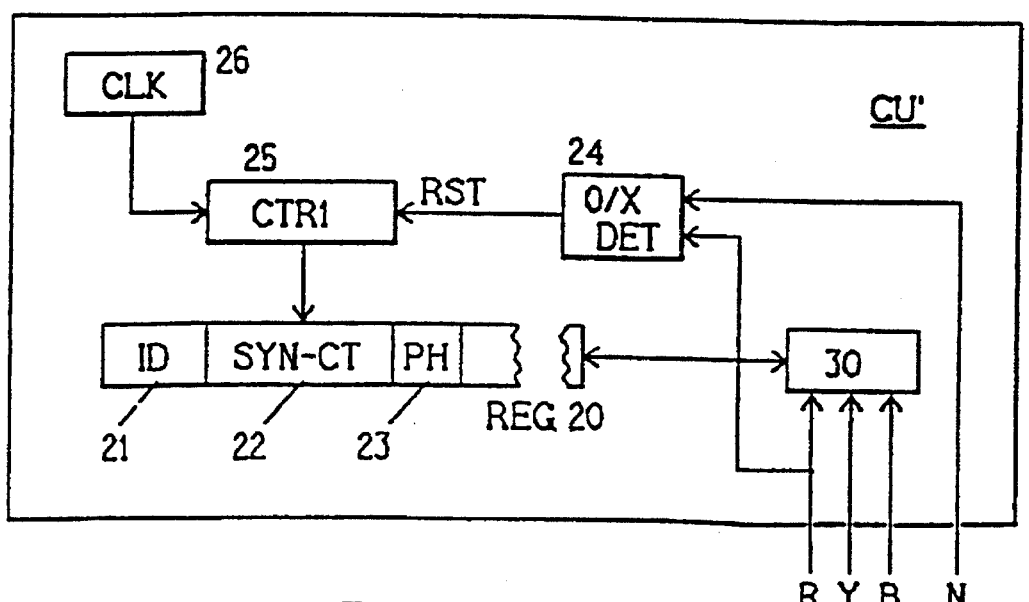

A remote metering system embodying the present invention will now be described, by way of example, with reference to the drawings, in which: FIG. 1 is a set of waveforms of a 3-phase supply; FIG. 2 is a partial block diagram of the remote metering system; FIG. 3 is a more detailed block diagram of the parts of the meters concerned with determining the phase of the meters; and FIG. 4 is a more detailed block diagram of the parts of the central station concerned with determining the phase of the meters.

FIG. 1 shows the waveforms of a 3-phase power supply. There are 3 phase waveforms. R, Y, and B, each voltage being relative to a common neutral reference level N. Below these waveforms, the synchronization points for units coupled to them are shown as R, Y, and B; also shown are the synchronization points R', Y', and B' for units which are coupled to them in reverse. The synchronization points are taken as the positive-going zero crossings of the waveforms.

FIG. 2 shows a small part of the remote metering system. There is a 3-phase power supply system 10, having 3 phase lines R, Y, and b and a neutral line N. There is a central station CS coupled to all 3 phases and there are 3 meters M1–M3 each coupled to a single phase as shown. (The connections of the meters to the power supply phases will in general be random.) Each meter couples the power supply to a respective load L1–L3, and also includes a communications unit CU coupled to the power supply phase of that meter. Similarly, the central station CS includes a communications unit CU', coupled to all three phases of the power supply.

FIG. 3 shows a communications unit CU of one of the meters M1–M3. This includes a message register REG 10 which is coupled to the supply system (by means of modem circuitry, not shown), so that it can transmit and receive messages. The register 10 includes various fields: for present purposes, the fields ID 11, SYN-CT 12, and PH 13 are relevant. Field ID 11 is for the identification of the meter: field SYN-CT 12 is for a synchronization count; and field PH 13 is for the phase of the meter. (The message register also has further fields (not shown) for conveying other information between the central unit and the meter, eg billing information, consumption data, and tariff rates. These fields are concerned with other aspects of the remote metering system which are not relevant for present purposes.)

The communications unit CU also includes a zero-crossing detector 0/X DET 14 feeding the reset input of a synchronization counter CTR1 15 which is continuously fed from a fast meter clock 16. The zero-crossing detector 14 generates a synchronizing pulse each time the phase with which the meter is supplied crosses zero in the positive direction, and resets the counter CTR1, which then counts up until it is reset by the next synchronizing pulse.

The central station CS includes a communications unit CU' which is similar to those in the meters. As shown in FIG. 4, this includes a message register 20 containing; various fields, including the fields ID 21, SYN-CT 22, and PH 23, which is coupled through a coupling unit 30 to all 3 phases of the power supply, since the central unit has to communicate with meters on all 3 phases. A zero-crossing detector 0/X DET 2-4 is fed from one phase (say R) of the power supply, and feeds the reset input of a synchronization counter CTR1 25 which is continuously fed from a fast central station clock 26. The zero-crossing detector 24 generates a synchronizing pulse each time the R phase crosses zero (positively), and resets the counter CTR1, which then counts up until it is reset by the next synchronizing pulse.

When the central station sends out a message to a meter, the count in the synchronization counter CTR1 25 is inserted into the synchronization count field SYN-CT 22 of the message being transmitted from the central unit's message register 20. When this message reaches the appropriate meter, eg meter M1, it is fed into the meter's message register 10. The synchronization count in the synchronization count field SYN-CT 12 is immediately compared with the current synchronization count in the meter's synchronization counter CTR1 15 by a comparator 17.

Assume for convenience that the counters 15 and 25 cycle through 360 counts, ie each starts at 0 and reaches a count of 359 before being reset. The comparator 17 can conveniently generate 7 different outputs, depending on the difference between the two synchronization counts fed to it:

R: 0–19, 340–359

B' 40–79

Y: 100–139

R': 160–199

B: 220–259

Y': 280–319

F: 20–39, 80–99, 140–159, 200–219, 260–279, 320–339. These ranges allow identification of the phase of the meter, with a failure or fault (F) range between each synchronization count range for differences which are potentially ambiguous. (The fast meter clocks 16 and the fast central station clock 26 all run at substantially the same rate, of course.) The bottom part of FIG. 1 indicates, the ranges of the synchronization counts for the 6 possible phases, with the gaps representing the F state.

This phase result (coded eg into 3 bits) is inserted into the phase field 13 of register 10, and is included in the next message transmitted to the central station. (That next message will generally be a return version of the message which has just been received.) The central station includes means (not shown) for storing the phase fields of messages received from meter units together with the contents of the identification fields of those messages, so that it builds up a listing of the phases of the various meters.

The phase field 23 of messages sent out from the central station is empty, and is ignored by the meters. Similarly, the synchronization count field of messages sent out by the meters to the central unit is also empty, and is ignored by the central station. (Obviously, if the messages include suitable type or format codes, these empty fields can instead be omitted.)

The communications unit CU of each meter also includes a second synchronization counter CTR2 18, which is coupled to the synchronization field of the meter's message register 10. If the meter has to act as a relay station, it receives a message in its message register for subsequent retransmission. The synchronization count in the message is copied into the synchronization counter CTR2 18 as soon as the message is received. This counter is fed from the fast meter clock, and counts up from the count initially loaded into it. The meter, acting as a relay station, may store the message for some time before forwarding (retransmitting) it.

When it does retransmit the message, on towards its final destination, the contents of the counter CTR2 18 are copied back into the synchronization count field 12 of the message register immediately before the retransmission. Thus the synchronization count of the retransmitted message matches the synchronization count which it would have if it had been transmitted directly from the central station.

Of course, the synchronization counting in counter 18 will normally be made cyclic, ie reset to 0 each time it reaches 359 (with the count rate assumption above).

It will of course be realized that the functions of the various counters, registers, comparators, &c can be implemented in a variety of ways, eg by means of suitable microprocessors and associated memories.

We claim:

1. A remote metering system comprising a multi-phase mains supply system (10) having a control unit (CS) and a plurality of single-phase consumer meter units (M1–M3) with messages passing between the meter units and the control unit, characterized by phase determining means comprising synchronizing means (CTR1, FIGS. 3 and 4) in the units for synchronizing their message processing to specific phases of the mains supply, and means (17) for determining the relative phases of the control unit and a meter unit from the timing (SYN-CT) of a message passing between them relative to the phases to which those units are synchronized.

2. A system according to claim 1, characterized in that each sending unit sends out its messages with their starts at the synchronization point and, and each receiving unit compares the instant when it receives the start of the message with its synchronization point.

3. A system according to claim 2, characterized in that the synchronization point is the positive-going zero crossing of its phase.

4. A system according to claim 1, characterized in that the phases detected comprise R, Y, B, R', Y', and B'.

5. A system according to claim 1, characterized in that each unit includes a timer which is synchronized to the synchronization point, and includes in each message the count of the timer when the message is actually transmitted.

6. A system according to claim 1, characterized in that the phase of a meter unit is determined by the control unit.

7. A system according to claim 1, characterized in that the phase of a meter unit is determined by that meter unit and is included in messages returned by that meter unit to the control unit.

8. A system according to claim 7, characterized by repeater means which relay messages with no significant time delay.

9. A system according to claim 1, characterized by repeater means which store and forward messages, each relay means measuring the time delay between its receiving a message to be forwarded and its retransmission of that message, and including that time delay in the message, as the phase shift between receipt and retransmission.

10. A system according to claim 9 when appendant directly or indirectly on claim 5, characterized in that the relay means adds the phase shift in the relay means to the phase shift already in the message.

11. A system according to claim 9, characterized in that the relay means determines the phase of the units with which it communicates and incorporates the phase in a message to the central station.

12. A system according to claim 9, characterized in that each meter acts as a relay means.

* * * * *